United States Patent [19]

Busman et al.

[11] Patent Number: 5,763,134
[45] Date of Patent: Jun. 9, 1998

[54] COMPOSITION COMPRISING PHOTOCHEMICAL ACID PROGENITOR AND SPECIFIC SQUARYLIUM DYE

[75] Inventors: Stanley C. Busman, Minneapolis, Minn.; Richard J. Ellis, Essex, England; Jeanne E. Haubrich, Maplewood; William D. Ramsden, Afton, both of Minn.; Tran Van Thien, Essex, England; Gregory D. Cuny, Woodbury, Minn.

[73] Assignee: Imation Corp, Oakdale, Minn.

[21] Appl. No.: 645,303

[22] Filed: May 13, 1996

[51] Int. Cl.$^6$ .................................................. G03F 7/021
[52] U.S. Cl. .................. 430/157; 430/171; 430/270.1; 430/271.1; 430/277.1; 430/278.1; 430/920; 430/926; 430/944; 430/945
[58] Field of Search .................. 430/270.1, 920, 430/926, 944, 945, 271.1, 277.1, 278.1, 171, 163, 157

[56] References Cited

U.S. PATENT DOCUMENTS

| | | | |
|---|---|---|---|
| 4,554,238 | 11/1985 | Bushman | 430/258 |
| 5,340,699 | 8/1994 | Haley et al. | 430/302 |
| 5,360,694 | 11/1994 | Thien et al. | 430/200 |
| 5,401,607 | 3/1995 | Takiff et al. | 430/253 |
| 5,527,659 | 6/1996 | Yamaoka et al. | 430/270.1 |

FOREIGN PATENT DOCUMENTS

| | | |
|---|---|---|
| 0 568 993 A2 | 11/1993 | European Pat. Off. |
| WO 95/23357 | 8/1995 | WIPO |

*Primary Examiner*—John S. Chu
*Attorney, Agent, or Firm*—Gregory A. Evearitt; Arlene K. Musser

[57] ABSTRACT

Photochemical acid progenitors in combination with dihydroperimidine squarylium dyes have been found to be particularly effective at generating acid upon irradiation with near-infrared radiation. It has been found that dihydroperimidine squarylium dyes that are particularly useful in this invention have an oxidation potential greater than about 0.5 V relative to SCE as measured in dichloromethane.

24 Claims, No Drawings

COMPOSITION COMPRISING PHOTOCHEMICAL ACID PROGENITOR AND SPECIFIC SQUARYLIUM DYE

FIELD OF THE INVENTION

This invention relates to compositions for the photogeneration of acid. This invention also relates to processes for the photogeneration of acid.

BACKGROUND

Many processes are known using a medium which, when irradiated with electromagnetic radiation, generates an acid. This acid is then used to cause a change in the properties of the medium, so that exposed and unexposed portions of the medium differ in their properties. For example, many photoresist compositions are of this type; the acid produced upon exposure to (typically) ultraviolet radiation changes the solubility of the photoresist composition in the solution used to develop the photoresist. In most conventional acid-generating photoresist processes, the sensitivity of the medium to the exposing radiation is not of major concern. Exposure is normally effected using powerful ultraviolet sources. In addition, long exposures times can usually be tolerated.

Today, many imaging processes are being developed using near infrared radiation from semiconductor diode lasers. Semiconductor diode lasers have the advantage of being much less expensive than ultraviolet lasers. They are also well adapted for the production of high resolution images and for digital imaging processes (i.e., for producing hard copies of images stored on computers in digital form). The cost per unit intensity is less for an infrared producing high-resolution addressable source than for a comparable ultraviolet radiation producing source. The imaging speed of such infrared radiation using processes is presently limited by the sensitivity of the medium, and accordingly, there is a need to develop infrared sensitive imaging media with improved sensitivity.

Oftentimes, the sensitivity of photosensitive compositions can be increased if the photosensitive molecule catalyzes a secondary reaction which is not radiation-dependent, and if the photosensitive molecule also effects conversion of several molecules for each quantum of electromagnetic energy absorbed. For example, photoresist systems are known in which the primary photochemical reaction produces an acid, and this acid is employed to eliminate acid-labile groups in a secondary, radiation-independent reaction. See, for example, U.S. Pat. Nos. 3,923,514 and 3,915,706. Also, U.S. Pat. No. 5,094,371 discloses a radiation-sensitive mixture which contains a water-insoluble binder comprising a mixture of phenolic and novolak polymers soluble or dispersible in aqueous alkali, and an organic compound whose solubility in alkaline developer is increased by acid, and which also contains at least one acid-cleavable group, and in addition a further group which produces a strong acid upon exposure to radiation. A secondary acid generator (when used) "amplifies" the acid produced by an iodonium salt or other superacid precursor, resulting in several molecules of acid being produced for each molecule of superacid originally produced by decomposition of the iodonium salt. However, despite the increase in sensitivity achieved by such acid amplification, the contrast, and hence the quality of the resultant image is still governed by the original photochemical acid generation step. Accordingly, it is desirable to secure as high a quantum yield as possible during the photochemical acid generation step.

U.S. Pat. No. 5,286,604 discloses the use of a squarylium dye as a near infrared (NIR) light-to-heat converter for the thermal cleavage of tetrahydropyran groups from derivatized polyacrylate and methacrylate polymers for application in color proofing materials. However, the sensitivity of this system is quite low, i.e., 300–600 mJ/cm$^2$. There is no disclosure of a squarylium dye used as a spectral sensitizer for latent Bronsted acid generators.

U.S. Pat. No. 5,225,316 discloses the use of various classes of dyes including, but not limited to, aryl nitrones, xanthenes, anthraquinones, substituted-diaryl and triaryl methanes, methines, merocyanines, and polymethines, thiazoles, substituted- and unsubstituted-polycyclic aromatic hydrocarbons, and pyrylium dyes in combination with iodonium salts for the photochemical imagewise generation of acid to cleave tetrahydropyran groups from derivatized polyacrylate and methacrylate polymers for application in no-process printing plates. However no mention was made specifically of squarylium dyes.

European Patent Publ. No. 568,993 discloses combinations of squarylium dyes and latent Bronsted acid generators (iodonium salts, trichloromethyl-substituted triazines, etc.) for the generation of acid by exposure to visible and NIR light. The acid that is generated catalyzes various imaging mechanisms including thermal crosslinking and thermal deprotection of hydrolyzable groups from polymers. Several examples describe the thermal crosslinking of phenolic resins and melamine formaldehyde resins catalyzed by acid photogenerated by combinations of squarylium dyes and tris(trichloromethyl-s-triazine). None of the squarylium dyes disclosed contain a 2,3-dihydroperimidine terminal group.

U.S. Pat. No. 5,340,699 discloses the use of NIR squarylium dyes in combination with latent Bronsted acid generators such as diphenyliodonium salts or trichloromethyl-containing molecules to generate a strong Bronsted acid which is used to catalyze the thermal crosslinking of a combination of novolak resin and resole resin.

U.S. Pat. No. 5,401,607 discloses an acid-generating medium comprising an iodonium salt and a squarylium dye in which the squarylium dye absorbs in the range of 700–1200 nm. The squarylium dye preferably has an oxidation potential in methylene chloride of not greater than 500 mV relative to the saturated calomel electrode (SCE). This patent teaches that dyes having oxidation potentials greater than about 500 mV were found not to be good acid generators.

U.S. Pat. No. 4,554,238 discloses the use of sensitizing dyes in the range 300–900 nm as electron donor sensitizers of nitrobenzyl-blocked surfactants to release the Bronsted acid form of the surfactant. The patent states that spectral sensitizing compounds suitable for the invention include those disclosed in the art as being suitable for the spectral sensitization of photolyzable organic halogen compounds (including trichloromethyl-substituted triazines), and sulfonium and iodonium salts. NIR squarylium dyes are disclosed, but there is no teaching that squarylium dyes can sensitize latent Bronsted acid generators.

K. A. Bello, S. N. Corns and J. Griffiths, *J. Chem. Soc., Chem. Commun.*, 452–454, 1993 describes the condensation of 2,3-dihydroperimidines with squaric acid to give squarylium dyes having absorption maxima near 800 nm.

SUMMARY OF THE INVENTION

In one embodiment, the present invention provides an acid-generating medium comprising:

(a) a photochemical acid progenitor; and (b) a squarylium dye having a nucleus of the general formula:

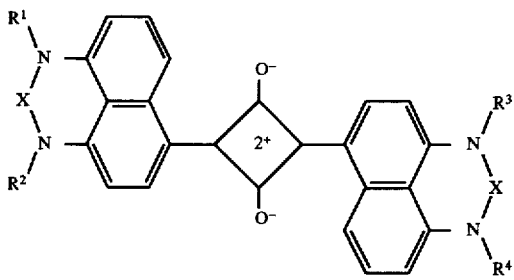

wherein:

$R^1$ to $R^4$ are independently selected from hydrogen, alkyl, cycloalkyl, aralkyl, carboalkoxyalkyl and carboaryloxyalkyl groups;

X represents $>CR^5R^6$, $>POR^7$, or $>BOR^7$ wherein:

$R^5$ and $R^6$ are independently selected from hydrogen, alkyl, cycloalkyl, aryl, and aralkyl groups;

or $R^1$ and $R^5$, and/or $R^2$ and $R^6$, and/or $R^3$ and $R^5$, and/or $R^4$ and $R^6$, and/or $R^5$ and $R^6$ represent the necessary atoms to complete a 5-, 6- or 7-membered ring; and $R^7$ represents an alkyl group.

It will be readily appreciated that the dyes of formula (I) may be represented by a number of different resonance structures, reflecting the many different ways in which the delocalized π-electron system may be visualized and notated. In formula (I) and elsewhere in this specification, the moiety:

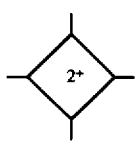

represents the aromatic dication derived from cyclobutadiene. This particular notation is chosen for convenience, and allows both the end groups and the central portion of the dye molecule to be depicted in full aromatized form. It must be emphasized, however, that formula (I) is to be interpreted as including all the possible resonance forms, such as:

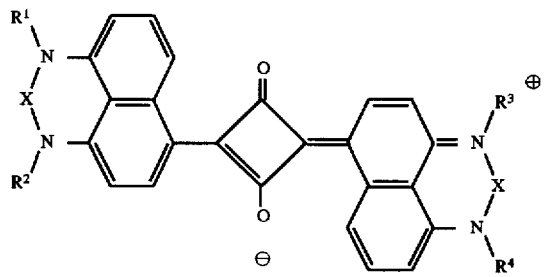

and the like.

In another embodiment, this invention provides an acid generating medium comprising:

(a) a photochemical acid progenitor selected from the group consisting of diaryliodonium salts, aryldiazonium salts, and 1,3,5-tris(trichloromethyl)-s-triazines; and (b) a squarylium dye having an oxidation potential in dichloromethane greater than or equal to 0.5 V and less than or equal to 0.8 V relative to a standard calomel electrode.

This invention also provides a process for generating acid, comprising the steps of:

(a) providing a mixture of a photochemical acid progenitor and a squarylium dye of the formula (I) disclosed earlier herein; and (b) irradiating the mixture with radiation from a light source, preferably a laser emitting in the near infrared region (700 to 1200 nm) of the spectrum.

It is generally accepted in the field of the present invention to allow substantial substitution on the core dye structure of the present invention. Some types of substitution, especially that which improves solubility in a selected solvent, is particularly desirable. Where the term "group" or "central nucleus" is used in describing an aspect of the present invention, that term implies that any type of substitution is acceptable, as long as the basic structure is maintained. For example, "alkyl group" would include not only standard hydrocarbon alkyls such as methyl, ethyl, cyclohexyl, isooctyl, undecyl, etc., but would also include substituted-alkyl such as hydroxymethyl, omega-cyanopropyl, 1,2,3-trichlorohexyl, 1-carboxy-isooctyl, phenyldecyl, and the like. The term "alkyl" or "alkyl moiety" indicates that there is no substitution on that defined component.

Other aspects, advantages, and benefits of the present invention are apparent from the detailed description, examples, and claims.

DETAILED DESCRIPTION OF THE INVENTION

Squarylium dyes of the present invention have a nucleus of the general formula:

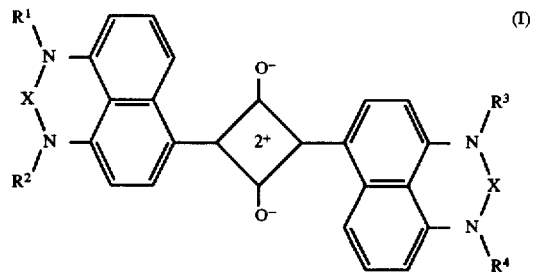

wherein:

$R^1$ to $R^4$ are independently selected from hydrogen, alkyl, cycloalkyl, aralkyl, carboalkoxyalkyl and carboaryloxyalkyl groups;

X represents $>CR^5R^6$, $>POR^7$, or $>BOR^7$ wherein:

$R^5$ and $R^6$ are independently selected from hydrogen, alkyl, cycloalkyl, aryl, and aralkyl groups;

or $R^1$ and $R^5$, and/or $R^2$ and $R^6$, and/or $R^3$ and $R^5$, and/or $R^4$ and $R^6$, and/or $R^5$ and $R^6$ represent the necessary atoms to complete a 5-, 6-or 7-membered ring; and $R^7$ represents an alkyl group.

Preferably, $R^1$ to $R^4$ are independently selected from hydrogen; a substituted or unsubstituted alkyl or cycloalkyl group having from 1 to 20 carbon atoms; an aralkyl group having from 6 to 20 carbon atoms such as benzyl or p-dodecylbenzyl; a carboalkoxyalkyl group with the alkoxy group having from 1 to 20 carbon atoms such as carboethoxymethyl or carbooctyloxymethyl; and a carboaryloxyalkyl group with the aryloxy group having from 5–20 carbon atoms such as carbo(p-dodecylphenol)methyl. Dyes in which one or more of $R^1$ to $R^4$ are other than hydrogen show enhanced solubility in organic solvents such as methylethylketone and 1-methoxy-2-propanol.

Preferably, $R^5$ and $R^6$ are independently selected from hydrogen; an alkyl or cycloalkyl group having from 1 to 20 carbon atoms; and a substituted or unsubstituted aryl group having from 5 to 20 carbon atoms. Examples of preferred groups from which $R^5$ and $R^6$ may be selected include —$CH_2OH$, —$CH_2OR^8$, —$CH_2OCH_2CO_2R^8$, —$CH_2OC(=O)R^8$, —$CH_2OSO_2R^9$, and —$CH_2OSi(R^9)_3$, wherein $R^8$ is independently an alkyl, alkaryl, aralkyl or aryl group and $R^9$ is independently an alkyl or alkaryl group. In addition, $R^5$ and $R^6$ taken together may form a 5- to 7-membered nucleus (e.g., heterocyclic, carbocyclic, etc.).

$R^1$ and $R^5$, and/or $R^2$ and $R^6$, and/or $R^3$ and $R^5$, and/or $R^4$ and $R^6$, and/or $R^5$ and $R^6$ taken together may represent the necessary atoms to complete a 5-, 6- or 7-membered ring. One example of the above situation would be where $R^1$ and $R^5$, and/or $R^3$ and $R^5$ are taken together to form a lactam group; $R^6$ is an alkyl or aryl group; and $R^2$ and $R^4$ are hydrogen.

Preferably, $R^7$ represents an alkyl group having from 1 to 20 carbon atoms.

Preferably, $R^8$ is independently selected from an alkyl, alkaryl, aralkyl or aryl group having from 1 to 20 carbon atoms.

Preferably, $R^9$ is independently an alkyl or alkaryl group having from 1 to 20 carbon atoms.

Squarylium dyes used in the present invention can be made according to procedures disclosed later herein, as well as those disclosed in U.S. Pat. Nos. 5,360,694 and 5,380,635.

Conventional photochemical acid progenitors (hereinafter known as acid progenitors) well known in the art can be used in the present invention. Non-limiting examples include s-triazine compounds substituted with at least one trihalomethyl group such as 2,4,6-tris(trichloromethyl)-s-triazine, 2-(4-methoxyphenyl)-4,6-bis-(trichloromethyl)-s-triazine, 2-(4-methoxy-1-naphthalenyl)-4,6-bis(trichloromethyl)-s-triazine and the like, iron-arene complexes such as ($\eta^6$-isopropylbenzene)($\eta^5$-cyclopentadienyl)iron (II) hexafluorophosphate, ($\eta^6$-xylenes) ($\eta^5$-cyclopentadienyl)iron (II) hexafluoroantimonate and the like, and onium salts such as diaryliodonium salts, triarylsulfonium salts, triarylselenonium salts, dialkylphenacylsulfonium salts, dialkyl-4-hydroxyphenylsulfonium salts, aryldiazonium salts, nitrobenzyl esters such as p-toluenesulfonic acid ester of p-nitrobenzyl alcohol and the like, sulfonic acid esters such as α-hydroxymethylbenzoinsulfonic acid ester and the like.

The imaging medium of the present invention desirably comprises a binder, preferably a polymeric binder, which serves to bind the infrared dye and the photochemical acid progenitor into a coherent layer which can be handled easily.

Non-limiting examples of binders include polymers and copolymers of acrylic acid or esters thereof, methacrylic acid or ester thereof, (anhydrous) maleic acid or esters thereof, acrylonitrile, styrene, α-alkylstyrene, α-acetoxystyrene, hydroxystyrene, α-alkylhydroxystyrene, α-acetoxyhydroxystyrene, or the substituted compounds obtained by protecting the hydroxy groups of the above compounds with a protecting group easily hydrolyzable by acid treatment (for example, trialkylsilyl group, tetrahydropyranyl group, t-butoxycarbonyl group and the like), or cyclic analogues thereof, vinyl acetate, vinyl chloride, vinylidene chloride, butadiene, crotonic acid, itaconic acid, N-substituted maleimide, vinyl benzoate, or copolymer of the above esters, polyethylene oxide, polyvinyl pyrrolidone, polyamide, polyurethane, polyethylene terephthalate, acetyl cellulose, methyl cellulose, ethyl cellulose, polyvinyl butyral, chlorinated polyolefin, polyalkylene, polyaldehyde, polycarbonate, epoxy resin, cresol novolak resin, resole resin, melamine resin, alkyd resin, modified polyvinyl alcohol, or block or graft copolymer or modified polymer by combination of them and the like. For applications such as positive acting printing plates, resists and proofs, binders which do not require a post exposure heating step before development will be preferred. Such binders include, for example, the homo- and copolymers of tetrahydropyranyl (meth)acrylate.

For improving the plasma-resistance upon development, a substituent containing silicone may be introduced in the binder before or after exposure to light.

Preferably, the proportion of the squarylium dye of formula (1) is 0.01 to 0.6 parts by weight (referred to as "part" hereinafter) relative to one part of acid progenitor, and preferably, the amount of the binder is 2 to 100 parts, and more preferably, 5 to 50 parts, relative to one part of the acid progenitor.

Though not wishing to be limited or restricted by any theory or mechanism for acid generation in the present invention, the process of acid formation from the combination of near infrared dyes of the present invention with acid progenitors may take place by one of several mechanisms. Efficient energy transfer from an excited state of a donor to a ground state receptor requires that the excited state energy of the donor is higher than the excited state energy of the receptor, as is well known in the art. Therefore, energy transfer from the irradiated excited state of the near infrared dye to the acid progenitor is unlikely due to the high singlet and triplet energies of the acid progenitors and the low excited state energies of the near-infrared dyes used in the present invention.

One method of introducing light energy in an imagewise fashion is the use of short pulses of high intensity laser light to excite the near infrared dyes of the present invention. The excited state of the irradiated near infrared dye can undergo radiationless transition back to the ground state of the dye resulting in light-to-heat conversion as is well known in the art. Depending on the fluence of the laser source, several hundreds of degrees centigrade can be achieved during the pulse or dwell time of the laser light. These high temperatures could then result in the thermal decomposition of the acid progenitors to produce acid. According to this mechanism, one might expect the sensitivity of the media of the present invention to be independent of the structure of the near infrared dyes used in the present invention since all of the dyes used in the present invention are capable of light-to-heat conversion. However, the sensitivities of the media used in the present invention are dependent on the dye structure. Although the light-to-heat conversion mechanism may still contribute to the generation of acid in the present invention, it does not appear to be the sole or dominant mechanism.

One possibility is that sensitization of acid progenitors by near-infrared dyes used in the present invention requires electron transfer from the excited state of the irradiated near-infrared dye to the acid progenitor. It is well known in the art that the efficiency of electron transfer depends strongly on the free energy change, $\Delta G^o$, associated with photoinduced electron transfer, in this case from the excited state of the near-infrared dye to the acid progenitor. This free energy change may be expressed by the Rehm-Weller relationship (D. Rehm and A. Weller, *Isr. J. Chem.*, 1970, 8, 259) as follows:

$$\Delta G^0 = (E_{ox}^{sens} - E_{red}^{init} - e_0^2/\epsilon a) - E_{0,0}^{sens}$$

where $E_{ox}^{sens}$ and $E_{red}^{init}$ are the ground state oxidation potential of the sensitizing near-infrared dye and reduction potential of the acid progenitor initiator, respectively, and $E_{0,0}^{sens}$ is the excitation energy of the 0,0 band of the sensitizing near-infrared dye. According to the Rehm-Weller relationship, the efficiency of electron transfer increases as the oxidation potential of the sensitizing dye becomes less positive and the reduction potential of the acid progenitor initiator becomes less negative. Indeed the effectiveness of the near-infrared dyes used in the present invention in generating acid has been found to correlate with the oxidation potential of the near-infrared dye. Accordingly, it is preferred that the dye used in the present invention have an oxidation potential in dichloromethane not greater than about 0.8 V, and more preferably, not greater than about 0.7 V, relative to a standard calomel electrode when the acid progenitor is diaryliodonium salts, aryldiazonium salts, or 1,3,5-tri(trichloromethyl)-s-triazine. Dyes having oxidation potentials greater than about 0.8 V have been found not to be good sensitizers of acid progenitors, presumably because the high oxidation potential of the dye renders the free energy change $\Delta G^0$ for electron transfer between the excited state of the near-infrared dye and the acid progenitor unfavorable. The preferred oxidation potential of near infrared dyes used in the present invention may vary, of course, for sensitization of acid progenitors of lower or higher reduction potential.

However, as the oxidation potential of the near infrared sensitizing dye becomes less positive and the reduction potential of the acid progenitor initiator becomes less negative, ground state electron transfer from the near infrared dye to the acid progenitor initiator becomes more favorable. Ground state electron transfer from the near infrared dye to the acid progenitor initiator can also lead to the formation of acid, which in turn can lead to instability of the imaging composition and shelf life problems which render the imaging composition useless. Therefore, as the oxidation potential of the sensitizing near-infrared dyes of the present invention becomes too low, shelf life problems may occur. Indeed the stability of the imaging compositions of the present invention have been found to correlate with the oxidation potential of the near-infrared dye. Accordingly, it is preferred that the dye used in the present invention has an oxidation potential in dichloromethane greater than about 0.55 V, and more preferably, greater than about 0.60 V, relative to a standard calomel electrode, if the acid progenitor is a diaryliodonium salt, aryldiazonium salt, or 1,3,5-tris(trichloromethyl)-s-triazine. The instability observed under accelerated aging conditions (3days at 60° C.) indicates that imaging media containing near infrared dyes used in this invention having oxidation potentials less than about 0.60 V would have limited utility when used with acid progenitors such as diaryliodonium salts, aryldiazonium salts, or 1,3,5-tris(trichloromethyl)-2,4,6-triazine.

Imaging compositions containing the near infrared dyes used in the present invention having oxidation potentials in the range of about 0.5 V to about 0.7 V have been found to have sufficient sensitivities to be useful in practice when the acid progenitor is diaryliodonium salts, aryldiazonium salts, or 1,3,5-tris(trichloromethyl)-s-triazine. Prior art near infrared dyes as disclosed in U.S. Pat. No. 5,401,607 were found not to be useful for sensitizing acid progenitors such as diaryliodonium salts when their oxidation potentials in dichloromethane were greater than about 0.5 V versus the standard calomel electrode.

A beneficial property of the near infrared dihydroperimidine squarylium dyes used in the present invention is their ability to achieve a wide range of oxidation potentials in the range of about 0.5 V to about 0.9 V by manipulation of the dihydroperimidine end group substituents. In this manner, the oxidation properties of the dye can be manipulated to give the best properties of sensitivity and shelf life in conjunction with the particular acid progenitor and imaging construction chosen.

Imaging compositions containing infrared dyes used in the present invention may be used to initiate any of the acid-dependent reactions initiated by prior art acid-generating reactions which produce an acid of comparable strength. Preferred acid-dependent reactions relate to chemical amplification resist compositions of the negative and positive type which can be characterized by high sensitivity to visible and near infrared regions of the electromagnetic radiation spectrum. For example, the present process may be used to trigger an acid-catalyzed polymerization reaction, an acid-catalyzed crosslinking reaction, an acid-catalyzed depolymerization reaction, an acid-catalyzed de-protection reaction, or an acid-catalyzed destruction of dissolution inhibiting agent.

For example, a negative type resist using a thermal acid-catalyzed crosslinking reaction, represented by the acid-catalyzed crosslinking of phenolic resins by a crosslinking agent, is known (U.S. Pat. No. 5,368,783). Such resists may require a heat treating step following the light irradiation. In this case it is preferred that the development temperature is less than the decomposition temperature of the acid generating initiator.

Compounds which may be used as crosslinking agents include amino compounds having as functional groups at least two alkoxymethyl groups, methylol groups, or acetoxymethyl groups and the like. Examples include melamine derivatives (e.g., hexamethoxymethylated melamine, available from Mitsui-Cyanamid, Ltd. as CYMEL® 300 series (1) and the like); benzoguanamine derivatives (e.g., methyl/ethyl mixed alkylated benzoguanamine resin, available from Mitsui-Cyanamid, Ltd. as CYMEL® 1100 series (2)) and the like); and glycoluril derivatives (e.g., tetramethylolglycoluril, available from Mitsui-Cyanamid, Ltd. as CYMEL® 1100 series (3) and the like). Also included are di-substituted aromatic compounds having functional groups such as alkoxymethyl groups, methylol groups, acetoxymethyl groups and the like. Examples of such compounds include 1,3,5-trihydroxymethylbenzene, 1,3,5-triacetoxymethylbenezene, 1,2,4,5-tetraacetoxymethylbenzene, and the like. These crosslinking agents can be synthesized according to the method described in Polym. Mater. Sci. Eng., 64, 241 (1991).

The amount of the crosslinking agent is preferably 0.1 to 100 parts, more preferably 0.2 to 50 parts, relative to one part of the photochemical acid generator.

Positive type resists based on acid-catalyzed de-protection reactions are known. For example, the de-protection of tetrahydropyran groups from derivatized polyacrylate and methacrylate polymers in which the exposed material becomes soluble in developer is disclosed in U.S. Pat. No. 5,102,771.

Positive type resists based on the acid-catalyzed destruction of a dissolution inhibiting agent in which the exposed material becomes soluble in developer are disclosed in European Patent Publ. No. 424,124 and U.S. Pat. No. 5,085,972. Such positive type resists consist of, for example, a novolak resin, a dissolution inhibiting agent such as the bis-tetrahydrofuranyl ether of bisphenol A, an acid progenitor such as a diaryliodonium salt, and a sensitizing dye for the acid progenitor.

Further, solvent (such as methylethylketone, 1-methoxy-2-propanol, ethyl cellosolve and the like), plasticizer (such as dioctyl phthalate and the like), dark reaction inhibitor, colorant composed of organic or inorganic dye or pigment and the like may be contained therein depending upon the use of the chemically amplifying resist.

A composition of the present invention is prepared, for example, by mixing the dye of formula (1), an acid progenitor, a binder and, if necessary, a crosslinking agent or dissolution inhibitor or the like. This composition may be coated by any method known in the art (e.g., knife coating, bar coating, curtain coating, etc.) on a substrate. The nature of the substrate is not critical and includes, for example, paper, plastic, glass, metal plates, etc. For example, a photosensitive material having high sensitivity to near infrared radiation can be prepared by coating a solution of the composition of the present invention dissolved in a solvent (such as methylethylketone and the like) on an aluminum plate having a treated surface, a silicon wafer, a glass plate, or a plastic film and the like, and drying.

In the practice of the present invention, light sources from the visible to near infrared are used to deliver an electromagnetic radiation pattern which can be absorbed by the dye of formula (I) in the imaging layers. Suitable light sources include mercury lamps, carbon arc lamps, xenon lamps, metal halide lamps, tungsten lamps, halogen lamps, flash lamps, light-emitting diodes, laser rays, semiconductor diode lasers, Ti-Sapphire lasers and the like.

It is advantageous to employ light sources which are relatively richer in near infrared wavelengths. Preferred non-laser light sources include high power (250 W to 10 kW) tungsten lamps and xenon lamps. When a laser is used it is preferred that it emit in the red or near infrared region of the electromagnetic spectrum, especially from about 700 to 1200 nm. Suitable laser sources in this region include Nd:YAG, Nd:YLF and semi-conductor lasers. The preferred lasers for use in this invention include high power single mode laser diodes, fiber-coupled laser diode arrays, and laser diode bars producing 0.1 to 12 W in the near infrared region of the electromagnetic spectrum.

The entire construction may be exposed at once, or by scanning, or with a pulsed source, or at successive times in arbitrary areas. Simultaneous multiple exposure devices may be used, including those in which the light energy is distributed using optical fibers, deformable micromirror arrays, light valves, and the like. Preferably, a solid state infrared laser or laser diode array is used. Sources of relatively low intensity are also useful, provided they are focused onto a relatively small area. If a non-laser light source is used, the entire construction may be exposed at once through an image mask, such as a graphic arts film mask or a chrome glass mask.

Exposure may be directed at the surface of the imaging layer containing the imaging materials of this invention, or through a transparent substrate beneath such an imaging layer. Exposure energies will depend on the type of sensitizer of compound (I), the type of photochemical acid generator, and the type of materials used in creating a negative or positive image. The rate of scanning during the exposure may also play a role. Exposure energies will be chosen so as to provide a degree of cure or reaction to be useful for the particular application. Laser exposure dwell times are preferably about 0.05 to 50 microseconds and laser fluences are preferably about 0.001 to 1 J/cm$^2$. Non-laser exposure dwell times are preferably about 5 seconds to about 10 minutes and fluences are preferably about 0.01 to 1 J/cm$^2$.

The following non-limiting examples further illustrate the present invention.

EXAMPLES

Instrumentation

All cyclic voltammograms were measured in dichloromethane containing 0.2M tetrabutylammonium tetrafluoroborate and 12 mg dye using a BAS 100/W Electrochemical Analyzer (Bioanalytical Systems, Inc., West Lafayette, Ind.). Where the oxidation is reversible, $E_{1/2}$ represents the average of the voltage values for $E_a$, the anodic peak current, and $E_c$, the cathodic peak current, observed in the cyclic voltammogram. The CV was run at 50 millivolts per second unless stated otherwise. The working electrode consisted of a 1 millimeter platinum wire imbedded in glass to give a surface area of 0.78 mm$^2$. The counter electrode was a platinum wire. The reference electrode was SCE. The cyclic voltammograms were corrected for the background signal for dichloromethane and tetrabutylammonium tetrafluoroborate solution.

Near Infrared/visible absorption spectra were measured using a Shimadzu MPC-3100 spectrophotometer (Shimadzu, Inc., Columbia, Md.). Absorption spectra of coatings on opaque substrates were made using the integrating sphere attachment for the Shimadzu spectrophotometer.

Laser Diode Exposure Assembly

Coated samples were taped to an external drum scanning configuration and scanned from the coating side using a focused laser spot from a collimated/circularized laser diode (SDL, Inc., San Jose, Calif., Model 5422-G1, 811 nm). The focused spot size was 8μ (full width at e$^{-2}$ level), and the power at the media was 110 mW. The cross-scan translation rate was 4.5μ/drum rotation. The circumference of the drum was 84.8 centimeters. Image data was transferred from a mass-memory system and supplied to the power supply which performed the image-wise modulation of the laser diode.

Materials

All materials for which preparation procedures are not given were obtained commercially, many from Aldrich Chemical Co., Milwaukee, Wis. Synthesized compounds were characterized such as by their $^1$H and $^{13}$C NMR, and IR spectra. The preparation of poly (tetrahydropyranylmethacrylate) is described in U.S. Pat. No. 5,102,771. Dyes 1a and 1g were prepared as described in U.S. Pat. 5,380,635. Dye 1h was prepared as described in WO Patent Application 92/09661. Dye 1i was prepared according to the method described in Kuramoto, et al., Dyes and Pigments, 1989, 11, 21.

Preparation of 2,2-Bis(hydroxymethyl)-2,3-dihydro-1H-perimidine

A mixture of 87.49 g (0.553 mol) of 1,8-diaminonaphthalene, 54.05 g (0.300 mol) of 1,3-dihydroxyacetone dimer, 38 mg of p-toluenesulfonic acid monohydrate, and 500 mL of absolute ethanol was refluxed for 3.3 hr. To the still hot solution was added 1 mL of concentrated ammonium hydroxide in 9 mL of water, and the mixture was poured into a beaker to cool and crystallize. After standing overnight, the product was filtered off and air dried to yield 97.806 g of the bis(hydroxymethyl) dihydroperimidine:

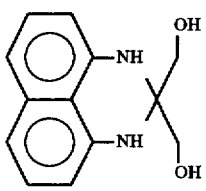

Preparation of Intermediate Dye A

A mixture of 28.00 g (0.1216 mol) of 2,2-bis(hydroxymethyl)-2,3-dihydro-1H-perimidine, 6.935 g (0.0608 mol) of squaric acid, and 200 mL of 1-propanol was heated at reflux with stirring for 1 hr. Then 25 mL of the solvent was distilled out, and the mixture cooled to room temperature. After 3 hr, a solid was filtered off and dried, yielding 29.445 g of Inter mediate Dye A:

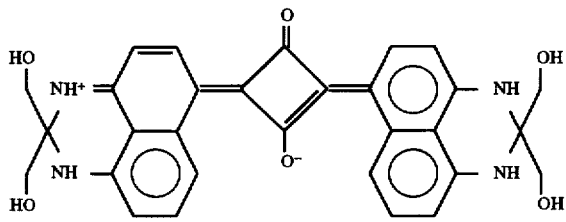

Intermediate Dye A was found to have a $\lambda_{max}$ of 808 nm in tetrahydrofuran.

Preparation Dye 1b

A mixture of 14.19 g (0.03851 mol) of 2,2-dibenzyl-2,3-dihydroperimidine (prepared by the condensation of 1,3-diphenylacetone with 1,8-diaminonaphthalene according to the general procedure found in U.S. Pat. No. 5,380,635), 2.196 g (0.01926 mol) of squaric acid, and 50 mL of n-octanol were heated with stirring under a Dean-Stark trap at a pressure of 40 torr at reflux for 48 min with water separation. After cooling to room temperature, the crude dye was filtered off, washed with heptane and with petroleum ether, and air dried to obtain 13.60 g. This was further purified by chromatography on a silica gel column gradient eluted with methylene chloride/heptane mixtures, collecting the green colored band. The dye had $\lambda_{max}$ 824 nm (MeOH).

Preparation Dye 1c

A mixture of 0.250 g (0.000464 mol) Intermediate Dye A, 0.142 g (0.00209 mol) of imidazole, and 0.315 g (0.00209 mol) of (t-butyl-dimethylsilyl chloride was stirred in 10 ml of dimethylformamide at room temperature for 18 hr. The mixture was poured into 240 ml of water, and the crude product was filtered off after 3 hr. Chromatography on a 20×190 cm silica gel column eluting with 25 % ethyl acetate in heptane yielded 0.157 g of Dye 1c, as the initial band. $\lambda_{max}$=800 nm (ethyl acetate).

Preparation of Dye 1d
(a) 1,3-dihydroperimidine derivative I

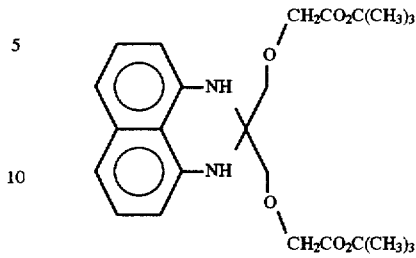

A mixture of 2,2-bis(hydroxymethyl)-2,3-dihydro-1H-perimidine (4.14 g, 18.0 mmol), benzene (45 mL), 50% aqueous sodium hydroxide (37.5 mL), tetrabutylammonium hydrogen sulfate (1.0 g, 2.94 mmol), and t-butyl bromoacetate (5.85 mL, 39.6 mmol) was vigorously stirred at room temperature for 18 hours using a mechanical stirrer. The reaction mixture was diluted with water (150 mL) and then extracted twice with chloroform (150 mL each). The chloroform extracts were combined and washed with brine (100 mL). The chloroform layer was dried using anhydrous magnesium sulfate, filtered, and then concentrated to give a tan solid. The solid was recrystallized with methanol to yield 3.90 g of 1,3-dihydroperimidine derivative I as tan crystals; m.p. 152°–154° C.; $^1$H NMR (500 Mz; CDCl$_3$): δ 1.46 (s, 18H); 3.70 (s, 4H); 4.01 (s, 5H); 5.20 (s, 2H); 6.51 (δ, 2H, J=7.3 Hz); 7.12 (δ, 2H, J=8.Hz); 7.21 (t, 2H, J=7.8 Hz); $^{13}$C{$^1$H} NMR (125 Mz; CDCl$_3$): δ 28.00, 67.09, 69.43, 72.53, 81.75, 105.88, 112.33, 116.87, 126.92, 134.34, 138.74, 169.56.

(b) Dye 1d. A mixture of the 1,3-dihydroperimidine derivative from part (a) (0.687 g, 1.5 mmol), squaric acid (0.086 g, 0.75 mmol), n-butanol (9 mL) and toluene (9 mL) was heated at reflux for 4 hours. The reaction mixture was allowed to cool and stand at room temperature overnight. The reaction mixture was filtered and the residue was washed with ethanol. The residual solid was dried under reduced pressure to give 0.420 g of Dye 1d as a dark blue solid, $\lambda_{max}$800 nm (acetone).

Preparation Dye 1e

A mixture of 15.57 g (0.1157 mol, 16.2 mL) of hexanoyl chloride in 40 mL of THF was added dropwise over 4 hr to a stirred mixture of 15.581 g (0.02893 mol) of Intermediate Dye A, 14.138 g (0.1157 mol) of 4-dimethylaminopyridine, and 600 mL of THF. After 18 hr at room temperature, the mixture was filtered to remove 4-dimethylaminopyridine hydrochloride, the salt washed with a little THF, and the combined filtrate evaporated to dryness. The resulting solid was stirred for 45 min in 200 mL of heptane, then filtered, and stirred in 200 mL of methanol for 50 min. After filtration and drying, 17.018 g were obtained. This material was recrystallized from ethyl acetate to yield 15.260 g of Dye 1e. $\lambda_{max}$805 nm (THF), $\epsilon$=1.63×10$^5$.

Preparation Dye 1f

A mixture of 0.828 g (0.00389 mol) of octanesulfonyl chloride in 5 ml of tetrahydrofuran was added over 1 hr to a stirred mixture of 0.524 g (0.000973 mol) of Intermediate Dye A and 0.475 g (0.00389 mol) of 4-dimethylaminopyridine in 16 ml of tetrahydrofuran. After 20 hr, the mixture was filtered and the filtrate evaporated to dryness. The resulting solid was stirred with heptane, filtered, stirred with methanol, filtered, and chromatographed on a 20×190 cm silica gel column gradient eluted with ethyl acetate in heptane to give 0.360 g of Dye 1f, as the initial band. $\lambda_{max}$=804 nm (ethyl acetate).

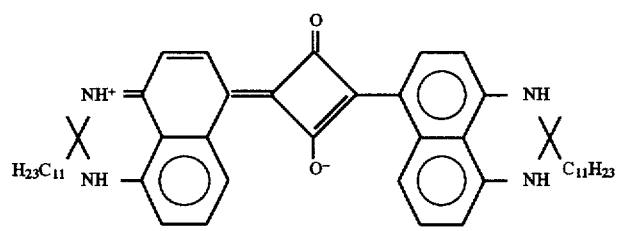
1a
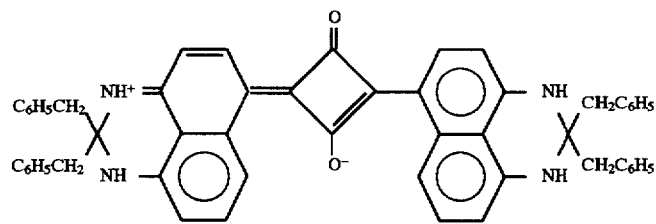
1b
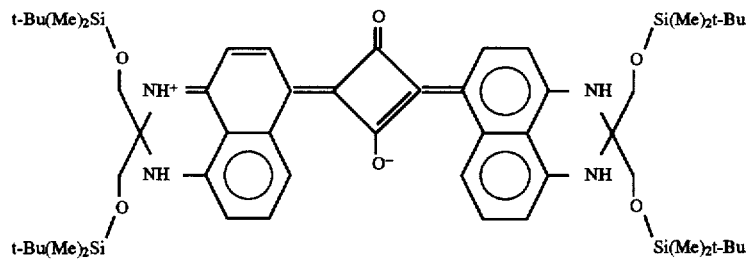
1c
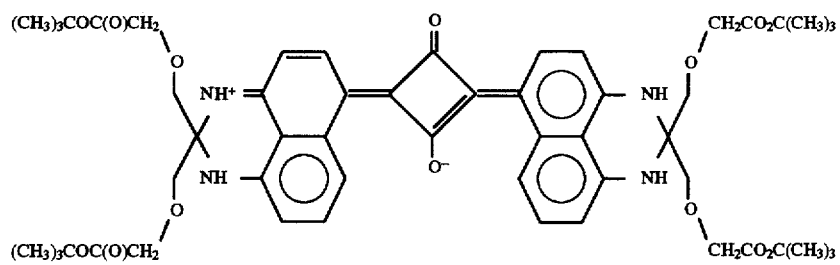
1d
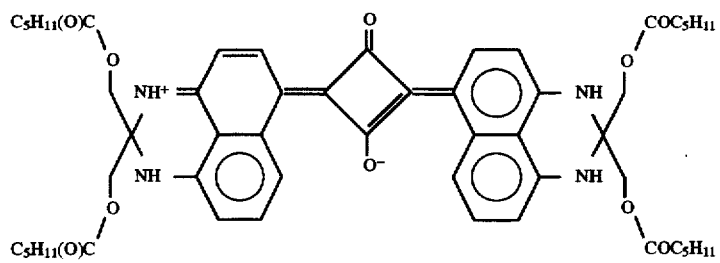
1e
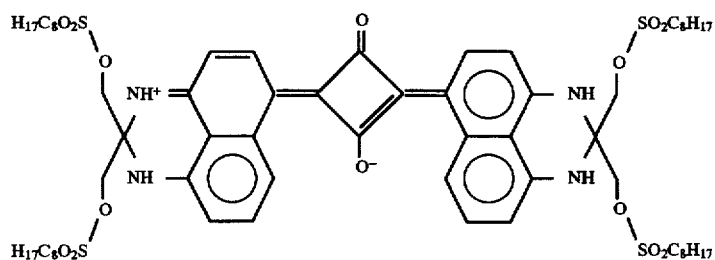
1f -continued

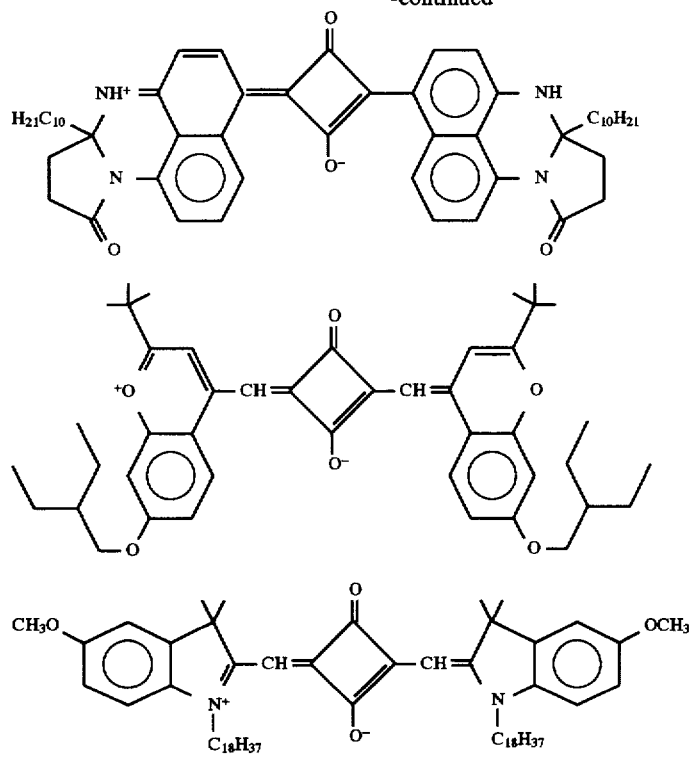

1g

1h

1i

TTT is 2,4,6-tris(trichloromethyl)-1,3,5-triazine and was prepared according to the procedure of K. Wakabayashi, M. Tsunoda, and T. Suzuki, Bull. Chem. Soc. Japan, 1969, 42, 2924.

Ditolyliodonium hexafluorophosphate was prepared according to the method of U.S. Pat. No. 3,981,897.

($\eta^6$-Xylenes) ($\eta^5$-cyclopentadienyl) iron (II) hexafluoro-antimonate was prepared according to the procedure in U.S. Pat. No. 5,059,701.

Dissolution inhibitor 1 (the bis-tetrahydropyranyl ether of bisphenol A) was prepared according to the procedure in European Patent Publ. No. 424,124.

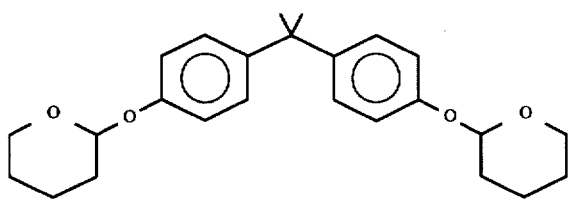

Preparation of 2-methoxy-4-phenylaminobenzenediazonium hexafluorophosphate

A mixture of 12 grams (37.1 mmol, 1.0 eq) of 2-methoxy-4-(phenylamino)benzenediazonium hydrogen sulfate (TCI America, Portland, Org.) in 600 mL of water was heated to 35°–40° C. and then filtered. To the filtrate was added a solution of 9.6 grams (52.0 mmol, 1.4 eq) of potassium hexafluorophosphate in 220 mL of water and a precipitate formed immediately. The mixture was stirred for 2 hours and collected by filtration, washed with water and then with approximately 100 mL of isopropanol and air dried to give 12.05 grams (87.5% yield) of 2-methoxy-4-phenylaminobenzenediazonium hexafluorophosphate.

EXAMPLE 1

A solution consisting of 2 g of 10% Novolak SD-126A (Borden Packaging & Industrial Products, Louisville, Ky.) in methylethylketone, 0.02 g of CYMEL 303 (American Cyanamid Co., Wayne, N.J.), 0.02 g TTT, and 0.003 g Dye 1a was coated with a No. 6 coating rod (R&D Specialties, Webster, N.Y.) onto 200 micron-thick grained and anodized aluminum printing plate base and dried with a heat gun.

A near infrared spectrum (integrating sphere) was taken of a sample of this coating when fresh and after 1 and 2 days at 60° C. The results are given in Table 1.

A fresh sample of the plate and a sample aged 2 days at 60° C. were scanned with the laser diode exposure assembly. Separate areas of the plate were scanned at a rate of 6, 8, and 10 revolutions per second (508, 678, and 848 centimeters per second, respectively). The scanned plates were heated for 60 seconds at 105° C. and developed with PCX positive plate developer (3M, St. Paul, Minn.). For the fresh plate, the coating remained on the plate exposed at all scan rates while the coating was developed off the plate in the unexposed areas. However, the unexposed coating remained on the plate for the sample aged 2 days at 60° C.

TABLE 1

Absorption spectra of plates before and after accelerated aging at 60° C.

| Dye | $\lambda_{max}$ | Abs ($\lambda_{max}$) | Abs (811 nm) |
| --- | --- | --- | --- |
| Fresh | 800 nm | 1.074 | 1.044 |
| 1 day, 60° C. | 798 nm | 0.859 | 0.835 |
| 2 days, 60° C. | 808 nm | 0.870 | 0.865 |

Table 1 shows that the absorption of Dye 1a dropped about 15% on accelerated aging for 2 days at 60° C. It appears that Dye 1a and TTT generate acid thermally; this acid can then catalyze the crosslinking of the novolak and melamine resins during the heating step with the result that the coating cannot be removed from the unexposed re-ions of the plate. The instability of Dye 1a in the presence of TTT may be due to the relatively low oxidation potential of Dye 1a ($E_{1/2}$=0.51 V versus SCE) and the relatively low reduction potential of TTT (peak reduction potential of approximately –0.83 V versus SCE).

EXAMPLE 2

Example 1 was repeated except that Dye 1e replaced Dye 1a.

A near infrared spectrum was taken of a sample of this coating when fresh and after 1 and 2 days at 60° C. The results are given in Table 2.

A fresh sample of the plate and a sample aged 2 days at 60° C. were exposed with the laser diode exposure assembly, heated and developed as in Example 1. Both fresh and aged samples left coating on the plate in the exposed areas at all scan rates of 6, 8, and 10 revolutions per second. In addition, there was no coating left in the unexposed areas. There were no signs of degradation of the coating after accelerated aging for 3 days at 60° C. These results indicate that Dye 1e is more stable than Dye 1a in the presence of TTT. This may be due to the higher oxidation potential of Dye 1e ($E_{1/2}$=0.68 V vs SCE) relative to Dye 1a ($E_{1/2}$32 0.51 V versus SCE).

TABLE 2

| Absorption spectra of plates before and after accelerated aging at 60° C. | | | |
|---|---|---|---|
| Dye | $\lambda_{max}$ | Abs ($\lambda_{max}$) | Abs (811 nm) |
| Fresh | 803 nm | 0.070 | 0.760 |
| 1 day, 60° C. | 806 nm | 0.827 | 0.813 |
| 2 days, 60° C. | 805 nm | 0.779 | 0.762 |

EXAMPLES 3–8 AND COMPARATIVE EXAMPLES 1–2

These examples demonstrate that the shelf life and sensitivity of coatings containing novolak resin, melamine formaldehyde resin, TTT and squarylium dye depend on the oxidation potential of the dye.

Coating formulations consisted of 1.92 g of 17% by weight novolak resin SD-126A in methylethylketone, 0.033 g CYMEL® 303, 0.028 g TTT, and dye. The formulations were coated with a No. 6 coating rod onto 200 micron thick grained and anodized aluminum printing plate base and dried with a heat gun.

Example 3. 0.006 g Dye 1a.
Example 4. 0.006 g Dye 1b.
Example 5. 0.008 g Dye 1c.
Example 6. 0.007 g Dye 1e.
Example 7. 0.009 g Dye 1f.
Example 8. 0.005 g Dye 1g (Dye 1g did not all dissolve in this formulation.)
Comparative Example 1. 0.005 g Dye 1h.
Comparative Example 2. 0.007 g Dye 1i.

Absorbances at $\lambda_{max}$ were determined from near infrared spectra (integrating sphere) of a sample of each of Examples 3–8 and Comparative Examples 1 and 2 when fresh and after aging at 60° C. The results are given in Table 3.

Relative sensitivities were determined by exposing a sample of each of Examples 3–8 and Comparative Examples 1–2 through a Stouffer 21-step sensitivity wedge (Olson Graphics, St. Paul, Minn.) using a 3M Model 70 tungsten light source (3M, St. Paul, Minn.) for 60 seconds (fresh coatings) or 120 seconds (coatings aged at 60° C.). After exposure, the plates were heated for 30 seconds (fresh coatings) or 60 seconds (coatings aged at 60° C.) at 115° C. The plates were developed using PCX positive plate developer. Sensitivity is proportional to the number of solid steps left on the plate. Solid steps are defined as those steps in which all the coating has been left on the plate. An open step is defined as an area where all the coating has been developed off the plate. Where fogging occurred, the first open step is the step at which their is no perceptible change in background density through step 21. Fogging refers to some residual coating left on the plate in the unexposed areas. The results are given in Table 3.

TABLE 3

| Example or Comparative Example | $\Delta E_p$ $E_{1/2}$ vs. SCE $(CH_2Cl_2)^a$ | $\lambda_{max}$ Absorbance: Fresh and after aging at 60° C. | Relative sensitivity of fresh plates and after aging at 60° C.[b] |
|---|---|---|---|
| Example 3 Dye 1a | $\Delta E_p$ = 0.074 V $E_{1/2}$ = 0.51 V | 827 nm Fresh: 0.956 1 day: 0.708 2 days: 0.667 5 days: 0.635 | Fresh: Solid 11, Open 15[c] 2 days, 60° C.: Solid 1, Open 4[d] 5 days, 60° C.: < Solid 1, Some fogging[d] |
| Example 4 Dye 1b | $\Delta E_p$ = 0.066 V $E_{1/2}$ = 0.54 V | 834 nm Fresh: 1.104 1 day: 0.656 4 days: 0.463 | Fresh: Solid 5, Open 10[c] 1 day, 60° C.: Solid 4, Open 7[d] 4 days, 60° C.: < Solid 1, No fogging[d] |
| Example 5 Dye 1c | $\Delta E_p$ = 0.079 V $E_{1/2}$ = 0.61 V | 823 nm Fresh: 0.806 1 day: 0.691 2 days: 0.686 5 days: 0.675 | Fresh: Solid 8, Open 13[c] 2 days, 60° C.: Solid 1, Open 5[d] 5 days, 60° C.: Solid 1, Open 5[d] |
| Example 6 Dye 1e | $\Delta E_p$ = 0.077 V $E_{1/2}$ = 0.68 V | 818 nm Fresh: 0.943 1 day: 0.855 2 days: 0.876 5 days: 0.834 | Fresh: Solid 3, Open 8[c] 2 days, 60° C.: Solid 3, Open 6[d] 5 days, 60° C.: Solid 2, Open 6[d] |
| Example 7 Dye 1f | $\Delta E_p$ = 0.130 V $E_{1/2}$ = 0.73 V (400 mV/sec sweep rate) | 817 nm Fresh: 0.797 1 day: 0.402 2 days: 0.425 5 days: 0.381 | Fresh: Solid 1, Open 3[c] 2 days, 60° C.: No image, no fogging[d] 5 days, 60° C.: < Solid 1, Open 4[d] |

TABLE 3-continued

| Example or Comparative Example | $\Delta E_p$ $E_{1/2}$ vs. SCE $(CH_2Cl_2)^a$ | $\lambda_{max}$ Absorbance: Fresh and after aging at 60° C. | Relative sensitivity of fresh plates and after aging at 60° C.[b] |
|---|---|---|---|
| Example 8 Dye 1g | $\Delta E_p = 0.094$ V $E_{1/2} = 0.89$ V | 813 nm Fresh: 0.323 1 day: 0.322 4 days: 0.326 | Fresh: < Solid 1, open 3[c] 1 day, 60° C.: Solid 1, Open 4[d] 4 days, 60° C.: No image, no fogging[d] |
| Comparative Example 1 Dye 1h | $\Delta E_p = 0.077$ V $E_{1/2} = 0.67$ V | 765 nm Fresh: 1.24 1 day: 1.196 4 days: 1.188 | Fresh: Solid 7, open 13[c] 1 day, 60° C.: Solid 8, Open 13[d] 4 days, 60° C.: Solid 8, Open 13[d] |
| Comparative Example 2 Dye 1i | $\Delta E_p = 0.077$ V $E_{1/2} = 0.48$ V | 667 nm Fresh: 0.964 1 day: 0.794 4 days: 0.747 | Fresh: Solid 10, open 17[c] 1 day, 60° C.: Solid 14, Open 21[d] 4 days, 60° C.: Solid 4, Open 11[d] |

[a]Cyclic voltammograms were run at 50 mV per second unless noted otherwise. $\Delta E_p$ is defined as the difference between the voltage values at $E_a$, the anodic peak current, and $E_c$, the cathodic peak current, observed in the cyclic voltammogram. $E_{1/2}$ represents the reversible half-wave oxidation potential and is equal to the average of the voltage values at $E_a$, the anodic peak current, and $E_c$, the cathodic peak current, observed in the cyclic voltammogram.
[b]The solid and open number refer to the step number on a Stouffer 21-step sensitivity wedge.
[c]The exposure time was 60 seconds and the heating time was 30 seconds.
[d]The exposure time was 120 seconds and the heating time was 60 seconds.

The data from absorbance measurements of fresh and 60° C. aged samples indicate that the stability of dyes in Examples 3–8 and Comparative Examples 1–2 in the presence of TTT is dependent on the oxidation potential of the dye; dyes are relatively unstable in the presence of TTT if their oxidation potential is less than about 0.65 V versus SCE. In addition, the sensitivity of samples containing dyes with an oxidation potential less than about 0.65 V versus SCE decreases more severely when aged at 60° C.

The sensitivity results for the fresh coatings indicate than the sensitivity is dependent on the oxidation potential of the dyes. As the oxidation potential of the dye increases, the sensitivity of the coatings tends to decrease; a dramatic decrease in sensitivity occurs above an oxidation potential of about 0.7 V versus SCE.

EXAMPLES 9–13 AND COMPARATIVE EXAMPLES 3–4

These examples demonstrate that the shelf life and sensitivity of coatings containing poly(tetrahydropyranyl methacrylate), ditolyliodonium hexafluorophosphate, and squarylium dye depend on the oxidation potential of the dye.

Coating formulations consisted of 2.0 g of 9% by weight poly(tetrahydropyranylmethacrylate) in methylethylketone, 0.03 g ditolyliodonium hexafluorophosphate, and dye. The formulations were coated with a No. 5 coating rod onto 200 micron thick grained and anodized aluminum printing plate base and dried with a heat gun.

Example 9. 0.016 g Dye 1a.
Example 10. 0.018 g Dye 1b.
Example 11. 0.015 g Dye 1c.
Example 12. 0.023 g Dye 1d.
Example 13. 0.016 g Dye 1e.
Comparative Example 3. 0.006 g Dye 1h.
Comparative Example 4. 0.009 g Dye 1i.

Absorbances at $\lambda_{max}$ were determined from near infrared spectra (integrating sphere) of a sample of each of Examples 9–13 and Comparative Examples 3 and 4 when fresh and after aging at 60° C. The results are given in Table 4.

Relative sensitivities were determined by exposing a sample of each of Examples 9–13 and Comparative Examples 3–4 (fresh and after aging at 60° C.) for 6 minutes through a Stouffer 21-step sensitivity wedge and a #25 Wratten gelatin cutoff light filter (Eastman Kodak, Rochester, N.Y.) using a Model 70 tungsten light source (3M, St. Paul, Minn). The plates were developed using PCX positive plate developer. The plates were then inked with black newspaper ink in the presence of water. Sensitivity is proportional to the number of clean, open steps on the plate that did not accept ink. An open step is defined as an area where all the coating was developed off the plate to reveal the hydrophilic aluminum surface. A solid step is defined as the first step which accepted a full density of black ink. The results are given in Table 4.

TABLE 4

| Example or Comparative Example | $\Delta E_p$ $E_{1/2}$ vs. SCE $(CH_2Cl_2)^a$ | $\lambda_{max}$ Absorbance: Fresh and after aging at 60° C. | Relative sensitivity of fresh plates and after aging at 60° C.[b] |
|---|---|---|---|
| Example 9 Dye 1a | $\Delta E_p = 0.074$ V $E_{1/2} = 0.51$ V | $\lambda_{max}$ 805 nm Fresh: 809 nm (0.859) 1 day: 837 nm (0.553) 2 days: 835 nm (0.414) 3 days: 837 nm (0.368) | Fresh: Open 6, Solid 9. 1 day, 60° C.: All the coating developed off the plate. |
| | | $\lambda_{max}$ 810 nm | Fresh: Open 5, Solid 7. |

TABLE 4-continued

| Example or Comparative Example | $\Delta E_p$ $E_{1/2}$ vs. SCE $(CH_2Cl_2)^a$ | $\lambda_{max}$ Absorbance: Fresh and after aging at 60° C. | Relative sensitivity of fresh plates and after aging at 60° C.[b] |
|---|---|---|---|
| Example 10 Dye 1b | $\Delta E_p = 0.066$ V $E_{1/2} = 0.54$ V | Fresh: 810 nm (0.847) 1 day: 819 nm (0.717) 2 days: 826 nm (0.593) 3 days: 830 nm (0.466) | 1 day, 60° C.: Open 5, Solid 9. 3 days, 60° C.: All the coating developed off the plate. |
| Example 11 Dye 1c | $\Delta E_p = 0.079$ V $E_{1/2} = 0.61$ V | $\lambda_{max}$ 792 nm Fresh: 793 nm (0.841) 1 day: 803 nm (0.773) 2 days: 817 nm (0.621) 3 days: 814 nm (0.556) | Fresh: Open 2, Steps 3–10 all accepted the same low density of ink, Solid 11. 1 day, 60° C.: Open 4, Solid 8. 3 days, 60° C.: All the coating developed off the plate. |
| Example 12 Dye 1d | $\Delta E_p = 0.089$ V $E_{1/2} = 0.62$ V | $\lambda_{max}$ 811 nm Fresh: 813 nm (0.480) 1 day: 814 nm (0.415) 2 days: 814 nm (0.367) 3 days: 817 nm (0.312) | Fresh: Open 3, Solid 8, some background staining. 1 day, 60° C.: Open 1, Steps 2–11 all accepted the same low density of ink, Solid 12. 3 days, 60° C.: Open 2, Solid 8. |
| Example 13 Dye 1e | $\Delta E_p = 0.077$ V $E_{1/2} = 0.68$ V | $\lambda_{max}$ 796 nm Fresh: 795 nm (0.865) 1 day: 799 nm (0.842) 2 days: 799 nm (0.835) 3 days: 800 nm (0.810) | Fresh: Open 5, Solid 7. 1 days, 60° C.: Open 4, Steps 5–11 all accepted the same low density of ink, Solid 12. 3 days, 60° C.: Open 1, Steps 2–12 all accepted the same low density of ink, Solid 13. |
| Comparative Example 3 Dye 1h | $\Delta E_p = 0.077$ V $E_{1/2} = 0.67$ V | $\lambda_{max}$ 768 nm Fresh: 768 nm (0.742) 1 day: 768 nm (0.728) 2 days: 767 nm (0.720) 3 days: 766 nm (0.712) | Fresh: <1 Open step, Solid 4. 3 days, 60° C.: <1 Open step, Solid 4. |
| Comparative Example 4 Dye 1i | $\Delta E_p = 0.077$ V $E_{1/2} = 0.48$ V | $\lambda_{max}$ 659 nm Fresh: 659 nm (0.790) 1 day: 660 nm (0.638) 2 days: 661 nm (0.557) 3 days: 660 nm (0.491) | Fresh: Solid 13, Steps 1–12 all accepted some ink. 1 days, 60° C.: Solid 20, Steps 1–19 all accepted some ink. 3 days, 60° C.: Solid 17, Steps 1–16 all accepted some ink. |

[a] Cyclic voltammograms were run at 50 mV per second unless noted otherwise. $\Delta E_p$ is defined as the difference between the voltage values at $E_a$, the anodic peak current, and $E_c$, the cathodic peak current, observed in the cyclic voltammogram. $E_{1/2}$ represents the reversible half-wave oxidation potential and is equal to the average of the voltage values at $E_a$, the anodic peak current, and $E_c$, the cathodic peak current, observed in the cyclic voltammogram.
[b] The solid and open number refer to the step number on a Stouffer 21-step sensitivity wedge.

The data from absorbance measurements of fresh and 60° C. aged samples indicate that the stability of dyes in Examples 9–13 and Comparative Examples 3–4 in the presence of di-(4-tolyl)iodonium hexafluorophosphate is dependent on the oxidation potential of the dye; dyes are relatively unstable in the presence of di-(4-tolyl)iodonium hexafluorophosphate if their oxidation potential is less than about 0.65 V versus SCE. In Examples 9–11 containing dyes with low oxidation potentials, all the coating developed off the plate in the aged samples, indicating thermal generation of acid at 60° C., resulting in cleavage of the poly (tetrahydropyranyl methacrylate) to polymethacrylic acid which is soluble in the developer.

These results suggest that the squarylium dyes disclosed in U.S. Pat. No. 5,401,607 with oxidation potentials less than about 0.5 V versus SCE would be unstable in the presence of iodonium salts such as di-(4-tolyl)iodonium hexafluorophosphate and therefore not be useful in coatings containing them and iodonium salts.

The results also show that coatings containing Dye 1e and di-(4-tolyl)iodonium hexafluorophosphate are significantly more sensitive than Dye 1h and di-(4-tolyl)iodonium hexafluorophosphate. Dye 1h belongs to the class of squarylium dyes disclosed in U.S. Pat. No. 5,401,607, wherein it states that squarylium dyes of that class with oxidation potentials above about 0.5 V versus SCE are not useful in the presence of iodonium salts for photogeneration of Bronsted acid. However, the dihydroperimidine dyes disclosed in this application are useful with iodonium salts, giving adequate sensitivity for practical applications even though their oxidation potentials are greater than 0.5 V versus SCE. Furthermore, the dihydroperimidine dyes are even more useful with iodonium salts since they can achieve good sensitivity and stability at oxidation potentials well above 0.5 V versus SCE.

EXAMPLE 14

A solution consisting of 4 g of 10% by weight poly (tetrahydropyranylmethacrylate) in 2:1 methylethylketone and Dowanol PM (Dow Chemical Co., Midland, Mich.), 0.030 g Dye 1e, and 0.060 g di-(4-tolyl)iodonium hexafluorophosphate was coated with a No. 5 coating rod onto 150 micron thick grained and anodized aluminum printing plate base that had been surface treated with polyacrylic acid and dried for 2 minutes at 80° C. The absorption spectrum of the coating was obtained for a fresh sample and the same sample after accelerated aging at 60° C. for 1,2, and 3 days. The aged sample was tested for loss of absorbance by Dye 1e at 830 nm. (See Table 5).

Six 4"×6" (10.2 cm×15.2 cm) samples of the coating, 14A–14F, were prepared for accelerated aging tests at 60° C.

for 1,2, and 3 days. Unexposed, aged plate samples 14A, 14B, and 14C were tested for weight loss after development with a developer consisting of the ratio 3.41 g triethanolamine, 1.59 g concentrated HCl, and 95 g water. (See Table 6).

Aged plate samples 14D, 14E, and 14F were scanned with the laser diode exposure assembly. The sample was weighed before exposure, after exposure, after hand development with a developer consisting of the ratio 3.41 g triethanolamine, 1.59 g concentrated HCl, and 95 g water, and after hand washing with acetone to remove any remaining coating. From these weighings, the coating weight (g/m$^2$), % mass lost after exposure, % mass lost after development, and % mass lost after acetone rinse were determined. The results are summarized in Table 7.

EXAMPLE 15

A solution consisting of 4 g of 10% poly(tetrahydropyranylmethacrylate) in 2:1 methylethylketone and Dowanol PM, 0.030 g Dye 1a, and 0.060 g di-(4-tolyl) iodonium hexafluorophosphate was coated with a No. 5 coating rod onto 150 micron thick grained and anodized aluminum printing plate base that had been surface treated with polyacrylic acid and dried for 2 minutes at 80° C. The absorption spectrum of the coating was obtained for a fresh sample and the same sample after accelerated aging at 60° C. for 1,2, and 3 days. The aged sample was tested for loss of absorbance by Dye 1e at 830 nm. (See Table 5).

TABLE 5

Loss of absorbance after accelerated aging.

| Sample | Abs. (830 nm) of fresh sample | Abs. (830 nm) after 1 day at 60° C. | Abs. (830 nm) after 2 days at 60° C. | Abs. (830 nm) after 3 days at 60° C. |
|---|---|---|---|---|
| Example 14 | 0.781 | 0.763 | 0.773 | 0.722 |
| Example 15 | 0.891 | 0.616 | 0.471 | 0.408 |

TABLE 6

Weight loss of unexposed and developed samples after accelerated aging.

| Sample | Coating wt (g/m$^2$) | % Weight lost after development | | |
|---|---|---|---|---|
| | | 1 day, 60° C. | 2 day, 60° C. | 3 day, 60° C. |
| Ex. 14A | 1.02 | 3.2% | — | — |
| Ex. 14B | 0.93 | — | 3.5% | — |
| Ex. 14C | 0.82 | — | — | 5.5% |
| Ex. 15A | 0.76 | 19.5% | — | — |
| Ex. 15B | 0.90 | — | 88.5% | — |
| Ex. 15C | 1.00 | — | — | 98.7% |

TABLE 7

Weight loss of exposed and developed samples after accelerated aging.

| Sample | Coat. wt. (g/m$^2$) | % Wt. loss after exposure | | | % Wt loss after development | | | % Wt loss after acetone wash | | |
|---|---|---|---|---|---|---|---|---|---|---|
| | | 1 day, 60° C.$^a$ | 2 day, 60° C.$^b$ | 3 day, 60° C.$^b$ | 1 day, 60° C.$^a$ | 2 day, 60° C.$^b$ | 3 day, 60° C.$^b$ | 1 day, 60° C.$^a$ | 2 day, 60° C.$^b$ | 3 day, 60° C.$^b$ |
| Ex. 14D | 0.96 | 19.6 | — | — | 80.4 | — | — | 0 | — | — |
| Ex. 14E | 0.91 | — | 17 | — | — | 81.6 | — | — | 1.4 | — |
| Ex. 14F | 0.96 | — | — | 21.6 | — | — | 77 | — | — | 1.4 |
| Ex. 15D | 0.90 | 15.7 | — | — | 84.3 | — | — | 0 | — | — |
| Ex. 15E | 0.87 | — | 17 | — | — | 83 | — | — | 0 | — |
| Ex. 15F | 0.94 | — | — | 20.7 | — | — | 78.6 | — | — | 0.7 |

$^a$Exposed at 6 rev./sec.
$^b$Exposed at 8 rev./sec.

Six 4"×6" (10.2 cm×15.2 cm) samples, 15A–15F, were prepared for accelerated aging at 60° C. for 1,2, and 3 days. Unexposed, aged plate samples 15A, 15B, and 15C were tested for weight loss after development with a developer consisting of the ratio 3.41 g triethanolamine, 1.59 g concentrated HCl, and 95 g water. (See Table 6).

Aged plate samples 15D, 15E, and 15F were scanned with the laser diode exposure assembly. The sample was weighed before exposure, after exposure, after hand development with a developer consisting of the ratio 3.41 g triethanolamine, 1.59 g concentrated HCl, and 95 g water, and after hand washing with acetone to remove any remaining coating. From these weighings, the coating weight (g/m$^2$), % mass lost after exposure, % mass lost after development, and % mass lost after acetone rinse are determined. The results are summarized in Table 7.

The results of Examples 14 and 15 show that Dye 1e is a much more stable dye than Dye 1a when used with di-(4-tolyl)iodonium hexafluorophosphate. Table 4 indicates that the absorption of Dye 1a decreases 54% after 3 days at 60° C., whereas the absorption of Dye 1e decreases only 7.5% after 3 days at 60° C. Table 5 indicates that 98.7% of the coating developed off an unexposed sample containing Dye 1a after 3 days at 60° C., whereas only 5.5% of the coating developed off an unexposed sample containing Dye 1e after 3 days at 60° C. The instability of Dye 1a may be due to oxidation of Dye 1a ($E_{1/2}$=0.51 V versus SCE) by di-(4-toly)iodonium hexafluorophosphate (peak reduction potential of approximately—0.67 V versus SCE) to generate acid, which cleaves poly(tetrahydropyranylmethacrylate) to poly (methacrylic acid), which is easily developed off the plate with the developer of Example 15. Plates containing Dye 1e would be expected to have good shelf-stability whereas plates containing Dye 1a would not.

COMPARATIVE EXAMPLE 5

Example 15 was repeated without di-(4-tolyl)iodonium hexafluorophosphate to give a coating weight of 0.76 g/m². A 4"×6" (10.2 cm×15.2 cm) sample was scanned at 6 rev/sec to give a 43.2% weight loss after imaging. Hand-development with the same developer used in Example 15 resulted in a further 30.5% weight loss. A final acetone washing removed a residual 26.3% of the coating.

EXAMPLE 16

A solution consisting of 2 g of 25% by weight poly (tetrahydropyranylmethacrylate) in Dowanol PM (primarily 1-methoxy-2-propanol, Dow Chemical Co., Midland, Mich.), 0.016 g Dye 1e, 0.04 g 2-methoxy-4-aminophenyl diazonium hexafluorophosphate, and 1.22 g methylethylketone was coated with a No. 5 coating rod onto 200 micron thick grained and anodized aluminum printing plate base, and dried for two minutes at 80° C. Separate areas of the plate were scanned with the laser diode exposure assembly at a rate of 4, 6, 8, 10 and 12 revolutions per second (339, 508, 678, 848, and 1,018 centimeters per second, respectively). The plate was developed using PCX positive plate developer. The plates were then inked with black newspaper ink in the presence of water. The areas exposed at 4,6, and 8 revolutions per second remained free of ink. The area exposed at 10 revolutions per second had slight toning of ink. The area exposed at 12 revolutions per second had severe toning of ink.

EXAMPLE 17

A solution consisting of 4.0 g of 10% by weight poly (tetrahydropyranylmethacrylate) in methylethylketone, 0.034 g Dye 1e, and 0.060 g of ($\eta^6$-xylenes) ($\eta^5$-cyclopentadienyl) iron (II) hexafluoroantimonate was coated with a No. 5 coating rod onto 150 micron thick grained and anodized aluminum printing plate base, and dried for two minutes at 8° C. A 4"×6" (10.2 cm×15.2 cm) sample of the coated plate was scanned with the laser diode exposure assembly at 6 revolutions per second (508 centimeters per second). The coating weight loss after exposure was 48%. The exposed sample was then hand-developed with PCX positive plate developer as in Example 1, resulting in a further coating weight loss of 49%, and leaving a residual coating weight of 1%. The residual material was detected after further washing with acetone.

EXAMPLE 18

A solution consisting of 2.0 g of 10% by weight poly (tetrahydropyranylmethacrylate) in methylethylketone, 0.016 g Dye 1e, 0.030 mg ($\eta^6$-xylenes) ($\eta^5$-cyclopentadienyl) iron (II) hexafluoroantimonate, and 0.012 mg diamyl oxalate was coated with a No. 5 coating rod onto 150 micron thick grained and anodized aluminum printing plate base, and dried for two minutes at 80° C. The sample was irradiated and developed as in Example 16. The sample lost 44% of its weight after irradiation, and the other 56% of its weight after development.

EXAMPLE 19

A solution consisting of 2.0 g of 10% by weight Novolak SD-126A in methylethylketone, 0.020 g di-(4-tolyl) iodonium hexafluorphosphate, 0.080 g Dissolution inhibitor 1, and 0.016 g Dye 1e was coated using a No. 5 coating rod onto 200 micron thick grained and anodized aluminum printing plate base and dried for two minutes at 80° C. The plate was irradiated using the laser diode exposure assembly at 3, 6, 7, 8, 9, and 11 revolutions per second. The plate was developed by wiping it with 8% by weight aqueous sodium metasilicate solution. Irradiated areas washed away to give a clear image at up to 8 revolutions per second.

EXAMPLE 20

A solution consisting of 4.0 g of 15% by weight Novolak SD- i126A in methylethylketone, 0.060 g di-(4-tolyl) iodonium hexafluorophosphate, 0.120 g of Dissolution inhibitor 1, 0.017 g of Dye 1e, and 0.004 g Foron Brilliant Blue (Sandoz Chemicals Corp., Charlotte, N.C.) dye was coated with a No. 16 coating rod on top of the copper layer in a film composed of a 4 micron copper layer on 50 micron thick Kapton polyimide substrate (E. I. DuPont de Nemours, Wilmington, Del.) and dried for two minutes at 80° C. The film was imaged using the laser diode exposure assembly at a drum speed of 4 revolutions per second. The image was developed by soaking the film in 6% by weight aqueous sodium metasilicate solution for 30 seconds, then rinsed with tap water. Copper was etched from the Kapton in the irradiated areas using a bath consisting of 150 g Enplate AD-4851 (Asarco Inc./Ethone-OMI, Inc., New Haven, Conn.) per liter of 2% sulfuric acid.

EXAMPLE 21

Magenta pigment construction: A coating solution was prepared consisting of 2.5 g of 20 weight % poly (tetrahydropyranylmethacrylate) in Dowanol PM, 0.08 g ditolyliodonium hexafluorophosphate, 0.04 g Dye 1e, 0.08 g magenta pigment millbase, and 1.5 g methylethylketone. The magenta millbase contained 0.0967 g RS magenta pigment dispersion (RBH Dispersants, Inc., subsidiary of Reichold Chemicals, Bound Brook, N.J.), 0.0967 g Joncryl 690 (acrylic resin, S. C. Johnson and Son, Racine, Wis.), 0.0116 g Disperbyk 161 (BYK Chemie, Wallingford, Conn.), 0.1987 g methylethylketone, and 0.5961 g Dowanol PM. The coating solution was prepared by addition of Dye 1e to methylethylketone followed by the addition of the iodonium salt, poly(tetrahydropyranylmethacrylate) solution, and magenta pigment millbase in that order. This solution was coated onto the surface of a polyvinylalcohol release layer on 50 micron thick polyester using a No. 6 coating rod and oven dried for 2 minutes at 80° C.

Adhesive receptor sheet: A solution consisting of 1.5 g Pliolyte SSA (styrene-butadiene copolymer, Goodyear Tire and Rubber Co., Akron, Ohio), 1.0 g Pliolyte AC (styrene-acrylate copolymer, Goodyear Tire and Rubber Co., Akron, Ohio), and 7.5 g toluene was coated with a No. 4 coating rod onto Matchprint commercial proofing paper stock (3M, St. Paul, Minn.).

The magenta pigment construction was laminated to the adhesive receptor sheet and the polyvinylalcohol-polyester release liner peeled away. The resulting magenta pigmented proofing film was imaged using the laser diode exposure assembly at a drum speed of 6 revolutions per second to a magenta color separation digital image. The exposed film was developed with Matchprint III developer (3M, St. Paul, Minn.). The exposed areas of the film developed off the film to give a positive magenta color separation proof.

What is claimed is:

1. An acid-generating composition comprising:
   (a) a photochemical acid progenitor; and
   (b) a squarylium dye having a nucleus of the general formula:

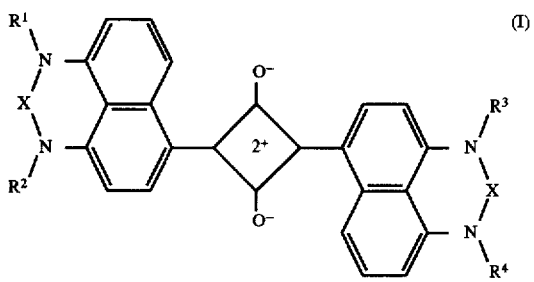

wherein:

$R^1$ to $R^4$ and group independently selected from hydrogen, alkyl, cycloalkyl, aralkyl, carboalkoxyalkyl and carboaryloxyalkyl groups;

X represents >$CR^5R^6$, >$POR^7$, or >$BOR^7$ wherein:

$R^5$ and $R^6$ are independently selected from hydrogen, alkyl, cycloalkyl, alkyl, and aralkyl groups;

or $R^1$ and $R^5$, and/or $R^2$ and $R^6$, and/or $R^3$ and $R^5$, and/or $R^4$ and $R^6$, and/or $R^5$ and $R^6$ represent the necessary atoms to complete a 5-, 6- or 7-membered ring; and $R^7$ represents an alkyl group.

2. The composition of claim 1 wherein $R^1$ to $R^4$ are independently selected from hydrogen; a substituted or unsubstituted alkyl or cycloalkyl group having from 1 to 20 carbon atoms; an aralkyl group having from 6 to 20 carbon atoms; a carboalkoxyalkyl group with the alkoxy group having from 1 to 20 carbon atoms; and a carboaryloxyalkyl group with the aryloxy group having from 5 to 20 carbon atoms.

3. The composition of claim 1 wherein $R^5$ and $R^6$ are independently selected from hydrogen; an alkyl or cycloalkyl group having from 1 to 20 carbon atoms; and a substituted or unsubstituted aryl group having from 5 to 20 carbon atoms.

4. The composition of claim 3 wherein $R^5$ and $R^6$ are independently selected from the group consisting of: —$CH_2OH$, —$CH_2OR^8$, —$CH_2OCH_2CO_2R^8$, —$CH_2OC(=O)R^8$, —$CH_2OSO_2R^9$, and —$CH_2OSi(R^9)_3$, wherein $R^8$ is independently an alkyl, alkaryl, aralkyl or aryl group and $R^9$ is an alkyl or alkaryl group.

5. The composition of claim 4 wherein $R^8$ is independently an alkyl, alkaryl, aralkyl or aryl group having from 1 to 20 carbon atoms and $R^9$ is an alkyl or alkaryl group having from 1 to 20 carbon atoms.

6. The composition of claim 1 wherein $R^7$ is an alkyl group having from 1 to 20 carbon atoms.

7. The composition of claim 1 wherein $R^1$ and $R^5$ are taken together and $R^3$ and $R^5$ are taken together to form lactam groups.

8. The composition of claim 1 wherein said acid progenitor is selected from the group consisting of trihalomethyl-substituted s-triazines, onium salts, iron arene complexes, nitrobenzyl esters, and sulfonic acid esters.

9. The composition of claim 8 wherein said trihalomethyl-substituted s-triazine is selected from the group consisting of 2,4,6-tris(trichloromethyl)-s-triazine; 2-(4-methoxyphenyl)-4,6-bis-(trichloromethyl)-s-triazine; and 2-(4-methoxy-1-naphthalenyl)-4,6-bis(trichloromethyl)-s-triazine.

10. The composition of claim 8 wherein said onium salt is selected from the group consisting of diaryliodonium salts, triarylsulfonium salts, triarylselenonium salts, dialkylphenacylsulfonium salts, dialkyl-4-hydroxyphenylsulfonium salts, and aryldiazonium salts.

11. The composition of claim 10 wherein the onium salt comprises di(4-tolyl)iodonium hexafluorophosphate or 2-methoxy-4-aminophenyl diazonium hexafluorophosphate.

12. The composition of claim 8 wherein said iron arene complex comprises ($\eta^6$-isopropylbenzene)($\eta^5$-cyclopentadienyl)iron (II) hexafluorophosphate or ($\eta^6$-Xylenes)($\eta^5$-cyclopentadienyl)iron (II) hexafluoroantimonate.

13. The composition of claim 1 further comprising a polymeric binder.

14. The composition of claim 13 wherein said polymeric binder is selected from the group consisting of novolak resins, melamine folmaldehyde resins, and tetrahydropyranyl(meth)acrylate homo- and co-polymers.

15. The composition of claim 13 wherein the amount of squarylium dye present is from 0.01 to 0.6 parts by weight relative to one part by weight of said acid progenitor.

16. The composition of claim 13 wherein the amount of said binder present is from 2 to 100 parts by weight relative to one part by weight of said acid progenitor.

17. The composition of claim 13 wherein the amount of said binder present is from 5 to 50 parts by weight relative to one part by weight of said acid progenitor.

18. The composition of claim 13 further comprising a crosslinking agent or a dissolution inhibitor.

19. The composition of claim 18 wherein the crosslinking agent comprises a compound having two or more alkoxymethyl groups, methylol groups, or acetoxymethyl groups.

20. The composition of claim 18 wherein the amount of crosslinking agent present is from 0.1 to 100 parts by weight relative to one part by weight of the acid progenitor.

21. The composition of claim 18 wherein the amount of crosslinking agent present is from 0.2 to 50 parts by weight relative to one part by weight of the acid progenitor.

22. An imaging composition comprising a substrate having coated thereon a photosensitive layer comprising:
(a) a photochemical acid progenitor; and
(b) a squarylium dye having a nucleus of the general formula:

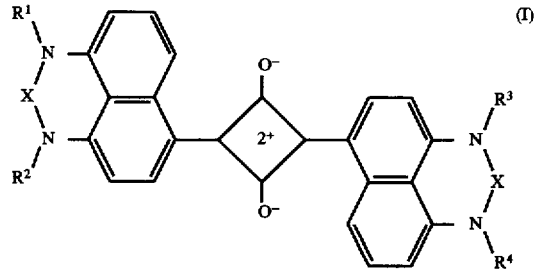

wherein:

$R^1$ to $R^4$ are independently selected from hydrogen, alkyl, cycloalkyl, aralkyl, carboalkoxyalkyl and carboaryloxyalkyl groups;

X represents >$CR^5R^6$, >$POR^7$, or >$BOR^7$ wherein:

$R^5$ and $R^6$ are independently selected from hydrogen, alkyl, cycloalkyl, aryl, and aralkyl groups;

or $R^1$ and $R^5$, and/or $R^2$ and $R^6$, and/or $R^3$ and $R^5$, and/or $R^4$ and $R^6$, and/or $R^5$ and $R^6$ represent the necessary atoms to complete a 5-, 6- or 7-membered ring; and $R^7$ represents an alkyl group.

23. The composition of claim 22 wherein said photosensitive layer further comprises a binder.

24. The composition of claim 22 wherein said substrate is selected from the group consisting of grained and anodized aluminum printing plate base, copper plated polyimide, and polyester.

* * * * *

UNITED STATES PATENT AND TRADEMARK OFFICE
CERTIFICATE OF CORRECTION

PATENT NO.: 5,763,134
DATED: June 9, 1998
INVENTOR(S): Busman et al.

It is certified that errors appear in the above-identified patent and that said Letters Patent is hereby corrected as shown below:

Col. 10, line 9, "BAS 100/W" should be --BAS 100B/W--.

Col. 12, line 29, "J=8.Hz);" should be --J=8.1 Hz);--.

Col. 17, line 22, "($E_{1/2}$32 0.51 V versus SCE)." should be --($E_{1/2}$ = 0.51 V versus SCE).--

Col. 26, line 10, "SD- i126A" should be --SD-126A--.

Col. 27, line 14, "and group" should be --are groups--.

Signed and Sealed this

Twelfth Day of October, 1999

*Attest:*

Q. TODD DICKINSON

*Attesting Officer*   Acting Commissioner of Patents and Trademarks